United States Patent [19]

Banjo et al.

[11] Patent Number: 4,890,197
[45] Date of Patent: Dec. 26, 1989

[54] MEMORY CARD HOUSING

[75] Inventors: Toshinobu Banjo; Yasuhiro Murasawa; Shigeo Onoda, all of Itami, Japan

[73] Assignee: Mitsubishi Denki Kabushiki Kaisha, Japan

[21] Appl. No.: 175,212

[22] Filed: Mar. 30, 1988

[30] Foreign Application Priority Data

Mar. 31, 1987 [JP] Japan .................................. 62-79921

[51] Int. Cl.⁴ ............................................. H05K 7/00
[52] U.S. Cl. .................................... 361/392; 235/488; 235/492; 361/394; 361/395
[58] Field of Search ................ 235/488, 492; 361/380, 361/392-395, 396, 399

[56] References Cited

U.S. PATENT DOCUMENTS 4,798,946 1/1989 Fujii et al. ......................... 235/492

Primary Examiner—Gregory D. Thompson
Attorney, Agent, or Firm—Leydig, Voit & Mayer

[57] ABSTRACT

A memory card comprises a plastic outer package which houses a semiconductor device and an electrical connector. The outer package comprises a plurality of package sections which are stacked atop one another and bonded together along connecting surfaces formed on the outer peripheries of the package sections. At least one of the connecting surface of each pair of adjoining package sections has an overflow groove for bonding agent formed therein which prevents the bonding agent from being forced to the outside of the outer package when the package sections are bonded together.

5 Claims, 1 Drawing Sheet

MEMORY CARD HOUSING

BACKGROUND OF THE INVENTION

This invention relates to a memory card which houses a semiconductor device, and more particularly to a memory card having an improved plastic outer package.

In recent years, external memory devices have been developed which comprise a thin, card-like, plastic outer package which houses a semiconductor device and a connector for electrically connecting the semiconductor device to external equipment. These so-called memory cards have found widespread use as storage devices for data and programs for video games and microcomputers. Typically, the plastic outer package of a memory card consists of two hollow package sections which are stacked atop one another. Each package section has a raised rim which extends around its periphery, and the top of each rim is a flat, smooth surface which serves as a connecting surface along which two adjoining package sections are connected. The two package sections are secured to one another by applying a viscous bonding agent to the connecting surfaces and pressing the connecting surface of one package section against the connecting surface of the other package section.

At the time of joining the two package sections together, the exertion of external pressure on the package sections during bonding may cause a portion of the bonding agent to be forced from between the connecting surfaces to the outside of the outer package, greatly marring the appearance of the outer package.

SUMMARY OF THE INVENTION

Accordingly, it is the object of the present invention to provide a memory card having an outer package which can be assembled without bonding agent being forced to the outside of the package and marring its appearance.

A memory card in accordance with the present invention comprises an outer package, a semiconductor device which is housed within the outer package, and an electrical connector which is housed within the front end of the outer package and is electrically connected to the semiconductor device. The outer package comprises a plurality of package sections which are stacked atop one another and bonded together on their confronting surfaces. Each package section has a rim which extends around its periphery, and each rim has a connecting surface formed thereon which confronts and is bonded to the connecting surface of the adjoining package section. The connecting surface of at least one of the package sections of each pair of adjoining package sections has an overflow groove for bonding agent formed therein along its outer periphery. When the package sections are joined together by applying a bonding agent to their connecting surfaces and pressing them together, any excess bonding agent flows into the overflow grooves and is not forced to the outside of the outer package. Accordingly, the appearance of the outer package is not marred by the bonding agent.

BRIEF DESCRIPTION OF THE DRAWINGS

In the figures, the same reference numerals indicate the same or corresponding parts.

DESCRIPTION OF THE PREFERRED EMBODIMENTS

Figure 1:
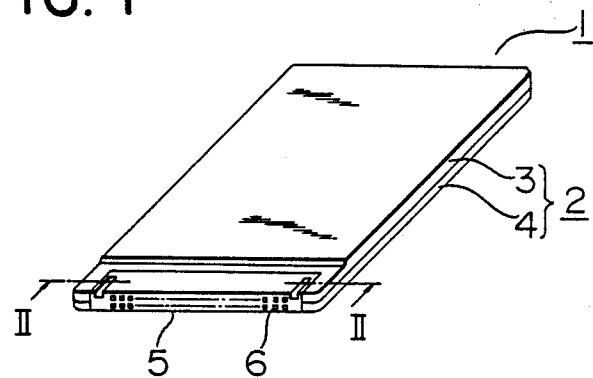
FIG. 1 is a perspective view of a first embodiment of a memory card in accordance with the present invention.

Hereinbelow, a number of preferred embodiments of a memory card in accordance with the present invention will be described while referring to the accompanying drawings, FIGS. 1 through 3 which illustrate a first embodiment. As shown in FIG. 1, a memory card 1 has an outer package 2 which comprises an upper package section 3 and a lower package section 4 which are stacked atop one another. Each package section is made of an electrically insulating material such as a synthetic resin. The front ends of the two package sections 3 and 4 support an electrical connector 5 having a plurality of sockets 6 formed therein. The sockets 6 are electrically connected to an unillustrated semiconductor device which is housed within the outer package 2. When the memory card 1 is used, it is inserted into an unillustrated memory card reader, and the sockets 6 of the connector 5 fit onto corresponding electrode pins of a connector of the unillustrated memory card reader.

Figure 2:
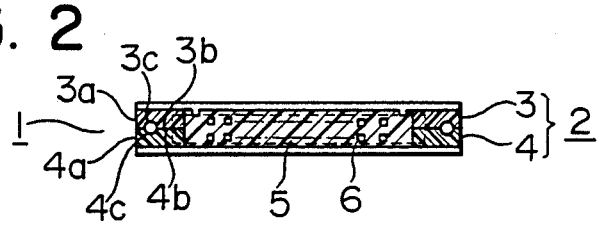
FIG. 2 is a cross-sectional view taken along Line II—II of FIG. 1.

As shown in FIG. 2, the upper package section 3 has a flat base on the outer periphery of which a raised rim 3a is formed. The rim 3a defines a recess inside of which the unillustrated semiconductor device is housed. The rim 3a has a flat upper surface which serves as a connecting surface 3b. An overflow groove 3c which extends continuously for substantially the entire length of the rim 3a is formed in the outer periphery of the connecting surface 3b.

Figure 3:
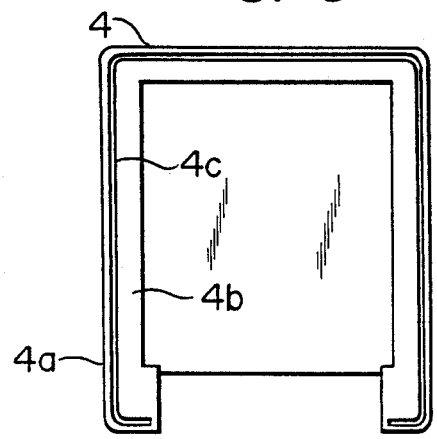
FIG. 3 is a top view of the lower package section of FIG. 1.

Similarly, the lower package section 4, which is shown in plan in FIG. 3, comprises a flat base having a raised rim 4a which is formed thereon and defines a recess for the unillustrated semiconductor device. The rim 4a has a flat upper surface which serves as a connecting surface 4b. A continuous overflow groove 4c corresponding to the overflow groove 3c of the upper package section 3 is formed in the outer periphery of the connecting surface 4b. The two overflow grooves 3c and 4c received any excess bonding agent which is forced from between the connecting surfaces 3b and 4b when pressure is applied to the package sections during bonding.

The outer package 2 is assembled by applying a bonding agent to the connecting surfaces 3b and 4b of the two package sections 3 and 4, positioning the package sections so that the connecting surfaces 3b and 4b confront one another, and then pressing the two package sections against each other. The external pressure applied to the package sections will cause any excess bonding agent to be forced from between the connecting surfaces 3b and 4b. Instead of flowing to the outside of the outer package 2, the excess bonding agent will flow into the overflow grooves 3c and 4c. Accordingly, the bonding agent can be completely prevented from reaching the outside of the outer package 2, and an outer package 2 having a good appearance can be obtained.

Figure 4:
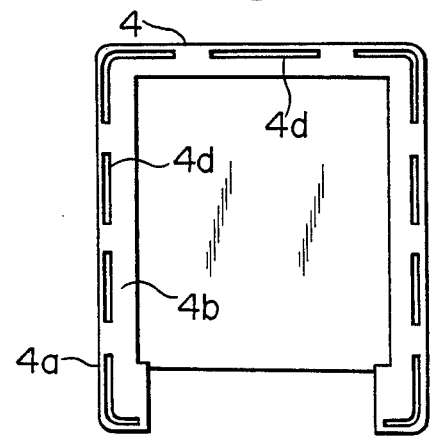
FIG. 4 is a top view of the lower package section of a second embodiment of the present invention.

In the embodiment of FIGS. 1 through 3, each package section has a single overflow groove which extends continuously along the periphery of the rim thereof. However, the overflow grooves need not be continuous, as shown in FIG. 4, which is a plan view of the lower package section 4 of a second embodiment of the present invention. In this embodiment, the lower package section 4 has a plurality of discontinuous overflow grooves 4d formed along the periphery of the connecting surface 4b of its rim 4a. Similarly, an unillustrated upper package section which is bonded to the lower package section 4 has a corresponding plurality of discontinuous overflow grooves formed therein. A plurality of discontinuous overflow grooves provide the same benefits as the continuous overflow grooves of the previous embodiment. The structure of this embodiment is otherwise identical to that of the embodiment of FIG. 1.

In the embodiment of FIG. 1, each package section has only a single overflow groove formed therein. However, it is also possible to form a plurality of overflow grooves in the connecting surface of each package section, the overflow grooves being spaced apart from one another on the connecting surface in which they are formed. Similarly, instead of having a single row of discontinuous overflow grooves 4d as shown in FIG. 4, it is possible to have a plurality of rows of discontinuous grooves 4d spaced apart from one another on the connecting surface of each package section.

In the preceding embodiments, overflow grooves are formed in both package sections, but the desired effects can be achieved so long as at least one of the package sections has an overflow groove formed in its connecting surface.

Furthermore, in the illustrated embodiments, the overflow grooves have a semicircular transverse cross section, but there is no restriction on the exact shape of the overflow grooves.

An electrical connector for connecting the semiconductor device to external equipment need not be in the form of the connector 5 used in the preceding embodiments. For example, the electrical connector may be in the form of a plurality of sockets which are provided in the front end of the surface of the outer package 2.

In addition, although the preceding embodiments both have an outer package 2 consisting of only two package sections, there is no restriction on the number of package sections constituting the outer package. For example, the outer package may comprise three layers stacked atop one another, i.e., an upper package section, a middle package section, and a lower package section. In this case, at least one of the connecting surfaces of each pair of adjoining package sections should have an overflow groove for bonding agent formed therein.

What is claimed is:

1. A memory card housing for housing a semiconductor device comprising:
    an electrical connector for electrically connecting a semiconductor device disposed within the housing to an external device; and
    an outer package for housing the semiconductor device and retaining said electrical connector, said outer package comprising a plurality of package sections stacked atop and bonded to one another, each package section having a substantially planar peripheral connecting surface, the connecting surface of one package section being bonded to the connecting surface of the adjoining package section, at least one of the bonded connecting surfaces including an overflow groove formed along the periphery thereof for receiving a bonding agent.

2. A memory card housing as claimed in claim 1 wherein said overflow groove extends continuously along said one connecting surface.

3. A memory card housing as claimed in claim 1 wherein said overflow groove extends discontinuously along said one connecting surface.

4. A memory card as claimed in claim 1 wherein the other connecting surface includes an overflow groove.

5. A memory card housing as claimed in claim 1 wherein said one of the connecting surfaces includes a plurality of spaced apart overflow grooves for receiving a bonding agent.

* * * * *